United States Patent
Furukawa et al.

(10) Patent No.: US 8,231,803 B2
(45) Date of Patent: Jul. 31, 2012

(54) PIEZOELECTRIC CERAMIC AND PIEZOELECTRIC CERAMIC COMPOSITION

(75) Inventors: Masahito Furukawa, Chuo-ku (JP); Daisuke Tanaka, Tokyo (JP); Masakazu Hirose, Chuo-ku (JP); Tadashi Takenaka, Noda (JP); Hajime Nagata, Noda (JP); Yuji Hiruma, Christchurch (NZ)

(73) Assignee: TDK Corporation, Chuo-ku, Tokyo (JP)

(*) Notice: Subject to any disclaimer, the term of this patent is extended or adjusted under 35 U.S.C. 154(b) by 0 days.

(21) Appl. No.: 12/933,507

(22) PCT Filed: Mar. 11, 2009

(86) PCT No.: PCT/JP2009/054688
§ 371 (c)(1),
(2), (4) Date: Sep. 20, 2010

(87) PCT Pub. No.: WO2009/119322
PCT Pub. Date: Oct. 1, 2009

(65) Prior Publication Data
US 2011/0017936 A1    Jan. 27, 2011

(30) Foreign Application Priority Data
Mar. 26, 2008 (JP) ................. 2008-081233

(51) Int. Cl.
C04B 35/00 (2006.01)
C04B 35/495 (2006.01)
(52) U.S. Cl. .................. 252/62.9 PZ; 252/62.9 R
(58) Field of Classification Search ........... 252/62.9 R, 252/62.9 PZ; 501/134, 135, 136; 117/949
See application file for complete search history.

(56) References Cited

U.S. PATENT DOCUMENTS

| | | | |
|---|---|---|---|
| 2005/0109263 A9* | 5/2005 | Chiang et al. | 117/47 |
| 2007/0152183 A1 | 7/2007 | Furukawa et al. | |
| 2008/0239627 A1* | 10/2008 | Bridger et al. | 361/321.5 |
| 2009/0267998 A1* | 10/2009 | Sakashita et al. | 347/68 |

FOREIGN PATENT DOCUMENTS

| | | |
|---|---|---|
| CN | 1511800 A * | 7/2004 |
| JP | 49-125900 | 12/1974 |
| JP | 57-6713 | 2/1982 |
| JP | 2-159079 | 6/1990 |
| JP | 11-217262 | 8/1999 |
| JP | 2000-44335 | 2/2000 |
| JP | 2000-272962 | 10/2000 |
| JP | 2005-179143 | 7/2005 |

(Continued)

OTHER PUBLICATIONS

Lin et al. "Synthesis and piezoelectric properties of lead-free piezoelectric [Bi0.5(Na1-x-yKxLiy)0.5]TiO3 ceramics", 2004, Materials Letters, vol. 58, pp. 615-618.*

(Continued)

*Primary Examiner* — Jerry Lorengo
*Assistant Examiner* — Lynne Edmondson
(74) *Attorney, Agent, or Firm* — Drinker Biddle & Reath LLP

(57) ABSTRACT

A piezoelectric ceramic 10 composed mainly of a three-component solid solution represented by the following general formula (1), wherein x, y and z in general formula (1) satisfy the following formulas (2), (3), (4) and (5).

$$x(Bi_{1/2}Na_{1/2})TiO_3-y(Bi_{1/2}Li_{1/2})TiO_3-z(Bi_{1/2}K_{1/2})TiO_3 \quad (1)$$

$$0.80 \leq x \leq 0.96 \quad (2)$$

$$0.02 \leq y \leq 0.08 \quad (3)$$

$$0.01 \leq z \leq 0.15 \quad (4)$$

$$x+y+z=1 \quad (5)$$

4 Claims, 2 Drawing Sheets

FOREIGN PATENT DOCUMENTS

JP  2005-179144  7/2005

OTHER PUBLICATIONS

Hiruma et al., 'Phase-Transition Temperatures and Piezoelectric Properties of (Bi1/2Na1/2)TiO3-(Bi1/2Li1/2)TiO3-(Bi1/2K1/2)TiO3 Lead-Free Ferroelectric Ceramics', Dec. 2007, IEEE Transactions, vol. 54, No. 12, pp. 2493-2498.*

Dunmin Lin et al., "Synthesis and piezoelectric properties of lead-free piezoelectric $[Bi_{0.5}(Na_{1-x-y}K_xLi_y)_{0.5}]TiO_3$ ceramics," Material Letters, 2004, pp. 615-618, vol. 58.

Zhi-Gang Gai, "Dielectric and piezoelectric characteristics of lead-free $0.94[Na_{0.96-x}K_xLi_{0.04})_{0.5} Bi_{0.5}] TiO_3$ -$0.06Ba(Zr_{0.055}Ti_{0.945}) O_3$ ceramics," Journal of Functional Materials and Devices, Feb. 25, 2006, pp. 15-18, vol. 12, No. 1 [Abstract].

* cited by examiner

PIEZOELECTRIC CERAMIC AND PIEZOELECTRIC CERAMIC COMPOSITION

TECHNICAL FIELD

The present invention relates to a piezoelectric ceramic and to a piezoelectric ceramic composition.

BACKGROUND ART

Piezoelectric ceramics have a function whereby an electrical charge is generated on the surface in response to external stress (conversion from mechanical energy to electrical energy), and a function whereby an externally applied electric field generates strain (conversion from electrical energy to mechanical energy), and in recent years they have been widely applied in the fields of ultrasonic motors, sensors and the like.

The main composition used for such piezoelectric ceramics is a solid solution of $PbZrO_3$ (PZ) and $PbTiO_3$ (PT) (PZT system). The reason for their use is that excellent piezoelectric characteristics can be obtained by using compositions near the crystallographic phase boundary (Morphotropic phase boundary) between rhombohedral PZ and tetragonal PT. A wide range of PZT-based piezoelectric ceramics have been developed for a large variety of needs by adding various additives or materials, and properties suited for different fields of use are desired. Also, solid solutions composed mainly of lead-based perovskite compositions such as $Pb(Mg,Nb)O_3$ (PMN) have been used as non-PZT-based piezoelectric ceramics.

However, these piezoelectric ceramics contain about 60-70 mass % lead oxide (PbO) as the major component. In PZT or PMN, for example, the mass ratio is about 2/3 lead oxide. This has led to concerns that large amounts of lead oxide may volatilize and diffuse into the air during production of such piezoelectric ceramics. Moreover, recovery of lead oxide in piezoelectric products is difficult, and elution of lead by acid rain when such products are exposed to outside air is another concern. From the viewpoint of protecting the environment, therefore, and considering the widening applications and increasing use of piezoelectric ceramics in the future, a demand exists for a piezoelectric ceramic with a satisfactorily reduced lead content.

The characteristics required for piezoelectric ceramics differ depending on the field in which they are used. For example, for high-power uses such as ultrasonic motors and piezoelectric transducers, it is desirable to have a high piezoelectric constant as preventing mechanical quality factor (Qm) reducing significantly during high-amplitude excitation. When used in an ultrasonic motor, such materials may be used under the high-temperature environment created by driving-induced self-heating, and therefore excellent piezoelectric characteristics must be exhibited in a wide temperature range.

Barium titanate ($BaTiO_3$) and bismuth laminar ferroelectric substances are known as piezoelectric ceramics containing no lead as a constituent element. However, since barium titanate has a low Curie point of 130° C. and loses its piezoelectric characteristics at above that temperature, it cannot be used for purposes that require piezoelectric characteristics at high temperatures. On the other hand, bismuth laminar ferroelectric substances usually have Curie points of 400° C. and higher and exhibit excellent thermal stability, but reducing the lead content makes it difficult to achieve excellent piezoelectric characteristics. In addition, because of their high crystal anisotropy, they require orientation for spontaneous polarization by hot forging or the like, and therefore room remains for improvement in productivity.

As alternative compositions for piezoelectric ceramics there have been disclosed two-component solid solutions of bismuth sodium titanate $((Bi_{1/2}Na_{1/2})TiO_3)$ and bismuth potassium titanate $((Bi_{1/2}K_{1/2})TiO_3)$, and two-component solid solutions of bismuth sodium titanate $((Bi_{1/2}Na_{1/2})TiO_3)$ and bismuth lithium titanate $((Bi_{1/2}Li_{1/2})TiO_3)$ (for example, see Patent documents 1 to 3).

[Patent Document 1] Japanese Patent Application Laid-Open HEI No. 11-217262
[Patent Document 2] Japanese Patent Application Laid-Open No. 2000-272962
[Patent Document 3] Japanese Patent Application Laid-Open No. 2000-44335

DISCLOSURE OF THE INVENTION

Problems to be Solved by the Invention

However, piezoelectric ceramics containing two-component solid solutions such as described in the aforementioned publications have inadequate piezoelectric characteristics compared to PZT-based substances, and therefore further improvement in the piezoelectric characteristics is desired. A demand also exists for piezoelectric ceramics that exhibit satisfactorily excellent piezoelectric characteristics in a wide temperature range including the high-temperature region.

It is an object of the present invention to provide a piezoelectric ceramic having satisfactorily excellent piezoelectric characteristics in a wide temperature range, and a piezoelectric ceramic composition that can be used to form the piezoelectric ceramic.

Means for Solving the Problems

Different types of piezoelectric ceramic compositions were examined with the aim of achieving the object stated above. In the two-component system of $(Bi_{1/2}K_{1/2})TiO_3$ and $(Bi_{1/2}Na_{1/2})TiO_3$ described in Patent Document 2, excellent piezoelectric characteristics can be obtained with the composition near the phase boundary (Morphotropic phase boundary) [K/(Na+K) ratio=0.2-0.3]. However, the piezoelectric characteristics of this composition are lost in the high-temperature region. On the other hand, it has been virtually impossible to achieve any improvement in piezoelectric characteristics or temperature characteristics when $(Bi_{1/2}Li_{1/2})TiO_3$, which contains Li, is dissolved in the aforementioned two-component system having the aforementioned composition near the phase boundary (M.P.B.).

However, as a result of much research it has been found that excellent piezoelectric characteristics can be realized in a wide temperature range by widely varying the proportion of $(Bi_{1/2}K_{1/2})TiO_3$ and $(Bi_{1/2}Na_{1/2})TiO_3$ away from near the phase boundary which has conventionally been considered suitable, and by including $(Bi_{1/2}Li_{1/2})TiO_3$ in the solid solution in a specific proportion.

Specifically, the present invention provides a piezoelectric ceramic containing a three-component solid solution as a major component, wherein the three-component solid solution is represented by the following general formula (1), wherein x, y and z in the general formula (1) satisfy the following formulas (2), (3), (4) and (5).

$$x(Bi_{1/2}Na_{1/2})TiO_3\text{-}y(Bi_{1/2}Li_{1/2})TiO_3\text{-}z(Bi_{1/2}K_{1/2})TiO_3 \qquad (1)$$

$$0.80 \leq x \leq 0.96 \qquad (2)$$

$$0.02 \leq y \leq 0.08 \quad (3)$$

$$0.01 \leq z \leq 0.15 \quad (4)$$

$$x+y+z=1 \quad (5)$$

Such a piezoelectric ceramic exhibits satisfactorily excellent piezoelectric characteristics within a wide temperature range. The reason for this effect is not thoroughly understood, but the present inventors offer the following conjecture. The solid solution as the major component of the piezoelectric ceramic of the invention has a small portion of the Na ion in $(Bi_{1/2}Na_{1/2})TiO_3$ replaced with K ion which has a much larger ion radius or with Li ion which has a much smaller ion radius, compared to Bi ion or Na ion. The replacement increases the regularity of the ion configuration at the A sites, thus allowing the depolarization temperature Td to be increased. It is believed that the significant increase in depolarization temperature Td according to the invention is made possible by replacement of a small amount of Na ion with both K ion and Li ion. The depolarization temperature (Td) is the temperature at which the piezoelectric characteristics of the piezoelectric ceramic completely disappear, and it is the maximum temperature at which piezoelectric characteristics are observed.

In the piezoelectric ceramic of the invention, z in general formula (1) preferably satisfies the following formula (6).

$$0.01 \leq z \leq 0.12 \quad (6)$$

By having z in the general formula (1) above represented by the range of the formula (6) above, it is possible to obtain a piezoelectric ceramic having excellent piezoelectric characteristics in a higher temperature region.

The piezoelectric ceramic of the invention preferably contains manganese element dispersed in the major component as an additive, and the manganese element content is preferably no greater than 0.93 mass % in terms of MnO with respect to the major component.

Including manganese element within this concentration range can produce a piezoelectric ceramic that can be used in a sufficiently wide temperature range and which has an even more excellent mechanical quality factor Qm. Presumably, if all or a portion of the manganese element is dissolved in the solid solution represented by general formula (1) above, the coercive electric field is enhanced and the mechanical quality factor Qm is improved.

The invention further provides a piezoelectric ceramic composition containing a three-component solid solution as a major component, wherein the three-component solid solution is represented by the following general formula (1), wherein x, y and z in the general formula (1) satisfy formulas (2), (3), (4) and (5) above.

This type of piezoelectric ceramic composition can be used to form a piezoelectric ceramic having the characteristics described above, by firing in a prescribed temperature range. The piezoelectric ceramic composition also permits a wider firing temperature range for fabrication of the piezoelectric ceramic. The piezoelectric ceramic composition can therefore be used to easily form the piezoelectric ceramic with satisfactorily excellent piezoelectric characteristics in the high-temperature region.

In the piezoelectric ceramic composition of the invention, z of the general formula (1) above preferably satisfies the formula (6) above. By using the piezoelectric ceramic composition having the range of z in the general formula (1) above represented by the range of the formula (6) above, it is possible to easily form the piezoelectric ceramic having excellent piezoelectric characteristics in an even higher temperature region.

The piezoelectric ceramic composition of the invention preferably contains manganese element dispersed in the major component as an additive, and the manganese element content is preferably no greater than 0.93 mass % in terms of MnO with respect to the major component.

This facilitates formation of a piezoelectric ceramic that can be used in a sufficiently wide temperature range and which has an even more excellent mechanical quality factor Qm.

Effect of the Invention

According to the invention it is possible to provide a piezoelectric ceramic that exhibits satisfactorily excellent piezoelectric characteristics within a wide temperature range. The piezoelectric ceramic of the invention is also environmentally friendly because of its reduced lead content. The invention can also provide a piezoelectric ceramic composition that can be used to form a piezoelectric ceramic having the aforementioned characteristics.

DESCRIPTION OF SYMBOLS

10: piezoelectric ceramic.

BEST MODE FOR CARRYING OUT THE INVENTION

Preferred embodiments of the invention will now be explained with reference to the accompanying drawings where necessary.

[Piezoelectric Ceramic]

Figure 1:
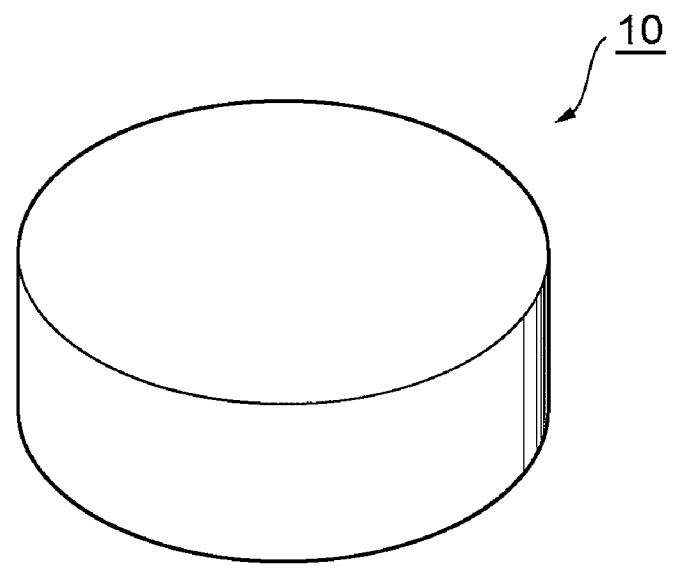
FIG. 1 is a perspective view of a preferred embodiment of a piezoelectric ceramic of the invention.

FIG. 1 is a perspective view of a preferred embodiment of a piezoelectric ceramic of the invention. The piezoelectric ceramic 10 contains a three-component solid solution with a rhombohedral crystal composition represented by the following general formula (1) as the major component.

$$x(Bi_{1/2}Na_{1/2})TiO_3\text{-}y(Bi_{1/2}Li_{1/2})TiO_3\text{-}z(Bi_{1/2}K_{1/2})TiO_3 \quad (1)$$

In general formula (1), x, y, z represent the molar ratios of each component, where x, y, z satisfy the following formulas (2), (3), (4) and (5).

$$0.80 \leq x \leq 0.96 \quad (2)$$

$$0.02 \leq y \leq 0.08 \quad (3)$$

$$0.01 \leq z \leq 0.15 \quad (4)$$

$$x+y+z=1 \quad (5)$$

Figure 2:
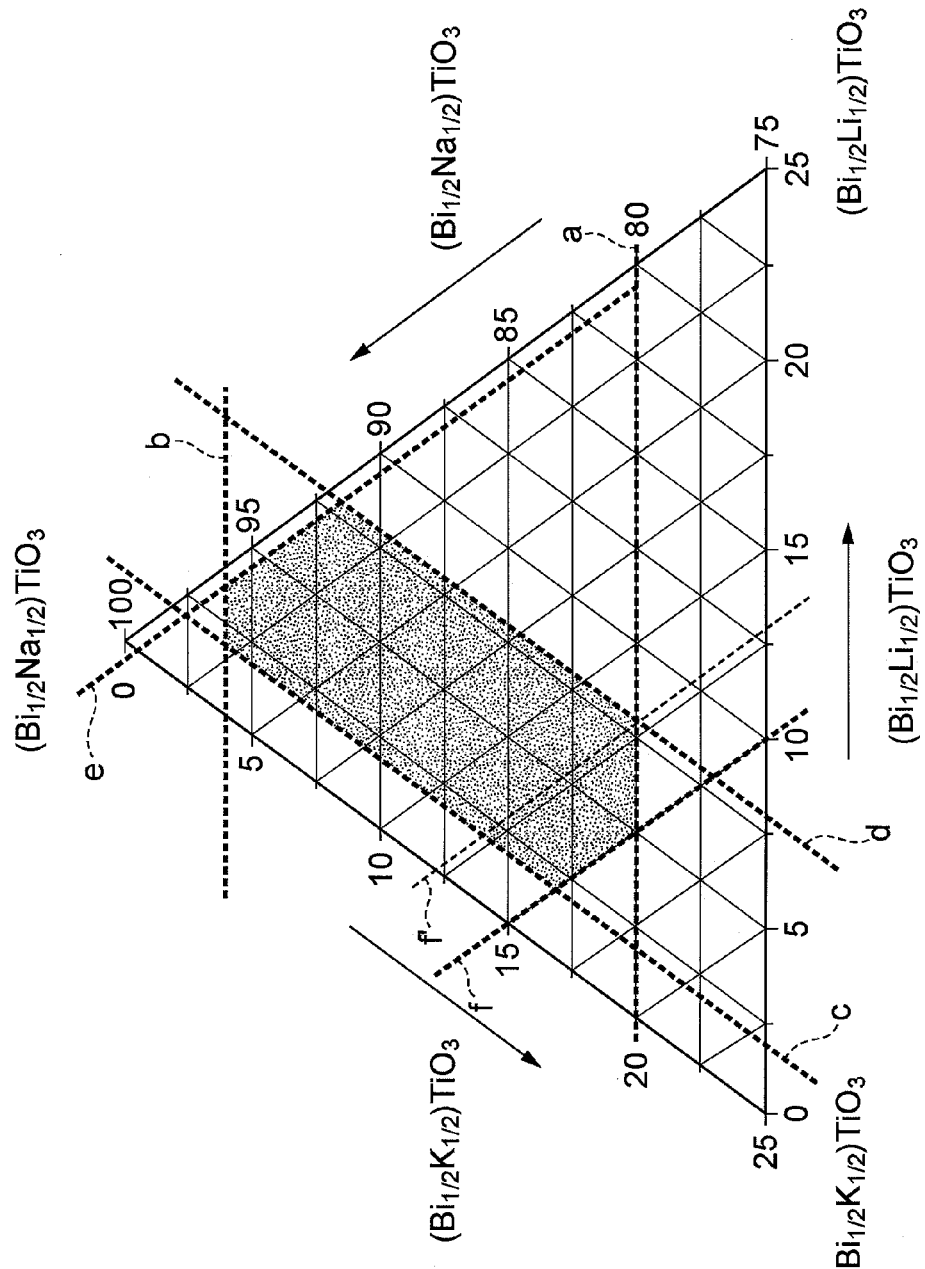
FIG. 2 is a phase diagram for a $(Bi_{1/2}Na_{1/2})TiO_3$-$(Bi_{1/2}Li_{1/2})TiO_3$-$(Bi_{1/2}K_{1/2})TiO_3$ system having the solid solution composition of the piezoelectric ceramic of this embodiment.

FIG. 2 is a phase diagram for a $(Bi_{1/2}Na_{1/2})TiO_3$-$(Bi_{1/2}Li_{1/2})TiO_3$-$(Bi_{1/2}K_{1/2})TiO_3$ system having the solid solution composition of the piezoelectric ceramic of this embodiment. The units for the numerical values on each axis in FIG. 2 are mol %.

In FIG. 2, line a represents x=0.80, line b represents x=0.96, line c represents y=0.02, line d represents y=0.08, line e represents z=0.01 and line f represents z=0.15. The solid solution of this embodiment has the composition in the region bounded by lines a, b, c, d, e and f in FIG. 2. (The shaded section in the drawing, including the lines themselves.)

Specifically, the piezoelectric ceramic 10 contains as the major component a solid solution with $(Bi_{1/2}Na_{1/2})TiO_3$, $(Bi_{1/2}Li_{1/2})TiO_3$ and $(Bi_{1/2}K_{1/2})TiO_3$ mutually dissolved in the prescribed proportions (molar ratios) specified by formulas (1)-(5) above. A piezoelectric ceramic containing this solid solution as the major component can achieve a high level of piezoelectric characteristics, namely the piezoelectric d constant ($d_{33}$) mechanical quality factor (Qm), and electromechanical coupling coefficient ($k_{33}$) in a wide temperature range. The piezoelectric ceramic 10 also has excellent aging characteristics at high temperatures, such that the deterioration of its piezoelectric characteristics in high-temperature environments can be adequately minimized.

The composition of the piezoelectric ceramic 10, and specifically the contents of the solid solution (major component) and additives, and the composition of the solid solution, can be confirmed by fluorescent X-ray analysis, X-ray diffraction, ICP emission spectroscopic analysis or the like. The piezoelectric d constant ($d_{33}$), mechanical quality factor (Qm) and electromechanical coupling coefficient ($k_{33}$) can be measured using a commercially available impedance analyzer.

When x is less than 0.80 in the composition of the solid solution shown in general formula (1) above, the temperature characteristic of the piezoelectric ceramic varies such that piezoelectric characteristics are no longer exhibited at relatively low temperature (for example, about 150° C.), thus narrowing the usable temperature range of the piezoelectric ceramic. When x is greater than 0.96, on the other hand, the mechanical quality factor is lowered and excellent piezoelectric characteristics are no longer exhibited. With an x value of 0.84 or greater it is possible to obtain a piezoelectric ceramic exhibiting excellent piezoelectric characteristics in an even wider temperature range.

When y is less than 0.02 in the composition of the solid solution, it is no longer possible to obtain a large piezoelectric d constant ($d_{33}$). When y is greater than 0.08, on the other hand, piezoelectric characteristics are no longer exhibited at relatively low temperature (for example, about 150° C.), thus narrowing the usable temperature range of the piezoelectric ceramic. In addition, the mechanical quality factor (Qm) is reduced and it is no longer possible to obtain excellent piezoelectric characteristics.

When z is less than 0.01 in the solid solution composition, the piezoelectric characteristics are no longer exhibited at relatively low temperature (for example, about 150° C.), thus narrowing the usable temperature range of the piezoelectric ceramic. When z is greater than 0.15, as well, the piezoelectric characteristics are no longer exhibited at relatively low temperature (for example, about 150° C.), thus narrowing the usable temperature range of the piezoelectric ceramic. The mechanical quality factor (Qm) is also reduced and it is no longer possible to obtain excellent piezoelectric characteristics.

In the composition of above solid solution, z is preferably 0.12 or less. In this case, in FIG. 2, line f' represents z=0.12. That is, by forming a solid solution having a composition in the region bounded by lines a, b, c, d, e and f' in FIG. 2 (including the lines themselves), it is possible to obtain a piezoelectric ceramic having excellent piezoelectric characteristics in an even higher temperature region.

The piezoelectric ceramic preferably comprises the solid solution represented by general formula (1) above. However, the solid solution may also contain additives such as metal oxides. The proportion of the solid solution with respect to the total piezoelectric ceramic is preferably 90 mass % or greater and even more preferably 95 mass % or greater. A piezoelectric ceramic wherein the proportion of the solid solution is at least 95 mass % with respect to the total piezoelectric ceramic exhibits notably excellent piezoelectric characteristics.

The piezoelectric ceramic of this embodiment more preferably contains a solid solution having the composition represented by general formula (1) above as the major component, and manganese element dispersed in the solid solution as an additive. This can further improve the mechanical quality factor in a sufficiently wide temperature range.

The manganese element may be present alone or in the form of a manganese-containing compound (manganese compound). There are no particular restrictions on the type of manganese compound used, and as specific examples of manganese compounds there may be mentioned manganese oxides such as MnO, and complex oxides of manganese element with other metal elements.

The content of manganese compounds is preferably no greater than 0.93 mass % and more preferably no greater than 0.12-0.49 mass % in terms of MnO with respect to the total solid solution represented by general formula (1). If the MnO content exceeds 0.93 mass %, the insulation resistance will tend to be reduced and polarization will be more difficult.

Since the crystal system of the solid solution as the major component of the piezoelectric ceramic of this embodiment undergoes no change even with increasing temperature, the temperature range at which piezoelectric characteristics are exhibited cannot be inferred from the Curie temperature. Therefore, the temperature range at which piezoelectric characteristics are exhibited by the piezoelectric ceramic of this embodiment can be evaluated by measuring the depolarization temperature (Td).

[Piezoelectric Ceramic Composition]

The piezoelectric ceramic composition of this embodiment contains the same major component as the piezoelectric ceramic 10 described above. That is, it is contains a three-component solid solution represented by general formula (1) above as a major component. It also preferably contains manganese element as an additive, similar to the piezoelectric ceramic 10. The piezoelectric ceramic composition may be, for example, a powder with a mean particle size of 0.3-3.0 μm, or aggregates. The aggregates may be formed into a powder by pulverization using a known method. After molding the powder, it may be fired at a prescribed temperature and the obtained sintered material subjected to polarization treatment to obtain the piezoelectric ceramic 10.

One embodiment of a process for production of a piezoelectric ceramic and piezoelectric ceramic composition according to the invention will now be explained. This embodiment comprises a mixing step in which the starting materials for the solid solution as the major component of the piezoelectric ceramic are mixed with the starting material for the manganese compound as the additive, a calcining step in which the mixture obtained from the mixing step is calcined and the obtained aggregates are pulverized and granulated to obtain a piezoelectric ceramic composition, a firing step in which the piezoelectric ceramic composition is shaped and fired to produce a sintered compact, and a polarization treatment step in which the sintered compact is subjected to polarization treatment. Each of these steps will now be explained in detail.

In the mixing step there are first prepared oxide powders containing bismuth, sodium, titanium, potassium and lithium as the starting materials for the solid solution as the major component of the piezoelectric ceramic (piezoelectric ceramic composition). If necessary, manganese oxide powder may be prepared as the starting material for the additive. The powders may be ordinary commercially available powders or powders synthesized by known methods. The starting materials used for the major component and additives may be, instead of oxides, materials that form oxides upon firing, such as carbonic acid salts or oxalic acid salts.

The starting materials are weighed out in proportions so that the composition satisfies formulas (2)-(5) above. When manganese oxide is added as a starting material for the additive, it is weighed out in a prescribed proportion with respect to the entirety of the major component. The weighed out starting materials for the major component and additive are thoroughly mixed in an organic solvent or water using a ball mill or the like. The mixing ratio of the starting materials can be varied to adjust the composition of the piezoelectric ceramic and piezoelectric ceramic composition.

Next, in the calcining step, the mixture obtained in the mixing step is dried, press molded and calcined at 800-900° C. for 2-4 hours to obtain aggregates. The aggregates are thoroughly pulverized in an organic solvent or water using a ball mill and dried. A binder is then added and the mixture is granulated to obtain a piezoelectric ceramic composition. Next, the granulated powder (piezoelectric ceramic composition) is press molded using an uniaxial pressing machine or cold isostatic press (CIP) to obtain a compact. The compact may be heated, subjected to binder removal and fired at 1100-1200° C. for 1-4 hours to obtain a sintered compact for a piezoelectric ceramic. The firing may be carried out in air. The sintered compact may also be worked into the desired shape if necessary.

In the polarization step, the sintered compact is subjected to polarization treatment by an ordinary method involving application of a prescribed electric field. This procedure yields a piezoelectric ceramic.

The embodiment described above is only a preferred embodiment of the invention, and the invention is in no way limited thereto.

EXAMPLES

The present invention will now be explained in greater detail based on examples and comparative examples, with the understanding that these examples are in no way limitative on the invention.

[Fabrication of Piezoelectric Ceramics]

Examples 1-5, 12 and Comparative Examples 1-10

As starting materials there were prepared commercially available starting powders of bismuth oxide ($Bi_2O_3$), sodium carbonate, ($Na_2CO_3$), potassium carbonate ($K_2CO_3$), lithium carbonate ($Li_2CO_3$) and titanium oxide ($TiO_2$). The starting powders were weighed out to the solid solution compositions (molar ratios) shown in Table 1, ethyl alcohol was added, and a zirconia ball was used for 10 hours of ball mill mixing. The slurry obtained by the ball mill mixing was sufficiently dried, and then press molded at 800-850° C. for 2 hours for calcination.

The piezoelectric ceramic composition obtained by calcination was subjected to fine grinding with a ball mill and dried, and approximately 10 g thereof was placed in a die with a diameter of 20 mm. A uniaxial press molding machine was used for pressing at 100 MPa as premolding, and then a CIP (cold isostatic press) was used for molding at a pressure of 150 MPa. The molded sample was subjected to firing at 1100-1200° C. for 2 hours to obtain a sintered compact.

After slicing the sintered compact to a thickness of 2 mm, the slice was cut to a prescribed size (length×width×height=2 mm×2 mm×5 mm), coated on both sides with commercially available Ag paste and burned at 700° C. Next, a 5 kV/mm electric field was applied for 5 minutes in silicon oil and the sintered compact was subjected to polarization treatment to obtain a piezoelectric ceramic. Thus, the piezoelectric ceramics of Examples 1-5, 12, and Comparative Examples 1-10 were produced.

Examples 6-11 and Examples 13-15

As starting materials there were prepared commercially available starting powders of bismuth oxide ($Bi_2O_3$), sodium carbonate, ($Na_2CO_3$), potassium carbonate ($K_2CO_3$), lithium carbonate ($Li_2CO_3$), titanium oxide ($TiO_2$) and manganese carbonate ($MnCO_3$). The starting powders were weighed out to the compositions (molar ratios) and manganese element contents shown in Table 1, ethyl alcohol was added, and a zirconia ball was used for 10 hours of ball mill mixing. Sintered compacts were fabricated in the same manner as Example 1 to obtain piezoelectric ceramics. Thus, the piezoelectric ceramics of Examples 6-11 and 13-15 were produced.

[Evaluation of Piezoelectric Ceramics]

<Measurement of Td>

The depolarization temperature (Td) of each of the polarization treated piezoelectric ceramics of the examples and comparative examples was measured based on the piezoelectric ceramic oscillator electrical test method (EMAS-6100). Specifically, each piezoelectric ceramic was placed in a thermostatic bath, the temperature was raised while measuring the piezoelectric characteristic with an impedance analyzer, and the depolarization temperature (Td) was measured as the temperature at which the piezoelectric characteristic completely disappeared. The measurement results are shown in Table 1.

<Measurement of Qm, $d_{33}$ and $k_{33}$>

The mechanical quality factor (Qm), piezoelectric d constant ($d_{33}$) and electromechanical coupling coefficient ($k_{33}$) were measured as the piezoelectric characteristics of each polarization treated piezoelectric ceramic. Specifically, an impedance analyzer (trade name: 4294A by Agilent Technologies) was used for measurement near a longitudinal vibration of 450 kHz by the resonance/antiresonance method. The Qm, $d_{33}$ and $k_{33}$ were calculated from the obtained measured values using an EMAS6000 Series. The calculated results are shown in Table 1. The Qm value was the value measured in 33-mode.

TABLE 1

| | Composition of solid solution (Moler ratio) | | | Amount of Mn element | Td | $k_{33}$ | $d_{33}$ | $Q_m$ |
|---|---|---|---|---|---|---|---|---|
| | x | y | z | (mass %) | (° C.) | (%) | (PC/N) | (33-mode) |
| Example 1 | 0.88 | 0.04 | 0.08 | 0 | 221 | 51 | 93 | 206 |
| Example 2 | 0.86 | 0.04 | 0.10 | 0 | 213 | 51 | 97 | 181 |
| Example 3 | 0.84 | 0.04 | 0.12 | 0 | 203 | 54 | 110 | 172 |
| Example 4 | 0.84 | 0.08 | 0.08 | 0 | 194 | 50 | 101 | 165 |

TABLE 1-continued

| | Composition of solid solution (Moler ratio) | | | Amount of Mn element | Td | $k_{33}$ | $d_{33}$ | $Q_m$ |
|---|---|---|---|---|---|---|---|---|
| | x | y | z | (mass %) | (° C.) | (%) | (PC/N) | (33-mode) |
| Example 5 | 0.80 | 0.08 | 0.12 | 0 | 177 | 53 | 123 | 125 |
| Comp. Ex. 1 | 1.00 | 0.00 | 0.00 | 0 | 186 | 46 | 75 | 275 |
| Comp. Ex. 2 | 0.96 | 0.04 | 0.00 | 0 | 196 | 47 | 76 | 200 |
| Comp. Ex. 3 | 0.92 | 0.08 | 0.00 | 0 | 170 | 48 | 85 | 169 |
| Comp. Ex. 4 | 0.90 | 0.10 | 0.00 | 0 | 150 | 48 | 93 | 141 |
| Comp. Ex. 5 | 0.88 | 0.12 | 0.00 | 0 | 135 | 49 | 99 | 110 |
| Comp. Ex. 6 | 0.96 | 0 | 0.04 | 0 | 187 | 48 | 84 | 237 |
| Comp. Ex. 7 | 0.94 | 0 | 0.06 | 0 | 204 | 49 | 83 | 131 |
| Comp. Ex. 8 | 0.90 | 0 | 0.10 | 0 | 203 | 46 | 87 | 177 |
| Comp. Ex. 9 | 0.80 | 0.04 | 0.16 | 0 | 162 | 57 | 138 | 125 |
| Comp. Ex. 10 | 0.76 | 0.08 | 0.16 | 0 | 147 | 57 | 153 | 96 |
| Example 6 | 0.88 | 0.04 | 0.08 | 0.12 | 219 | 49 | 86 | 320 |
| Example 7 | 0.88 | 0.04 | 0.08 | 0.25 | 213 | 49 | 87 | 351 |
| Example 8 | 0.88 | 0.04 | 0.08 | 0.37 | 204 | 49 | 85 | 392 |
| Example 9 | 0.84 | 0.04 | 0.12 | 0.12 | 197 | 51 | 118 | 123 |
| Example 10 | 0.84 | 0.04 | 0.12 | 0.25 | 193 | 49 | 109 | 132 |
| Example 11 | 0.84 | 0.04 | 0.12 | 0.37 | 192 | 51 | 114 | 150 |
| Example 12 | 0.82 | 0.04 | 0.14 | 0 | 183 | 55 | 141 | 114 |
| Example 13 | 0.82 | 0.04 | 0.14 | 0.12 | 178 | 53 | 135 | 127 |
| Example 14 | 0.82 | 0.04 | 0.14 | 0.25 | 175 | 51 | 126 | 134 |
| Example 15 | 0.82 | 0.04 | 0.14 | 0.37 | 172 | 52 | 117 | 140 |

In the table, the amount of Mn element is the amount of MnO conversion to the entire solid solution.

The piezoelectric ceramics of Examples 1-15, wherein x, y and z in the solid solution composition represented by general formula (1) above satisfied formulas (2)-(5), exhibited a relatively high depolarization temperature and a satisfactory balance of excellent characteristics including the piezoelectric d constant ($d_{33}$), mechanical quality factor (Qm) and electromechanical coupling coefficient ($k_{33}$). The piezoelectric ceramics of Examples 6-8, wherein x, y and z satisfied formulas (2)-(5) and manganese element was present in prescribed amounts, exhibited piezoelectric characteristics in the high-temperature range while also exhibiting a more excellent mechanical quality factor.

Industrial Applicability

According to the invention it is possible to provide a piezoelectric ceramic that exhibits satisfactorily excellent piezoelectric characteristics within a wide temperature range. The invention can also provide a piezoelectric ceramic composition that can be used to form a piezoelectric ceramic having the aforementioned characteristics.

The invention claimed is:

1. A piezoelectric ceramic comprising a three-component solid solution as a major component, the three-component solid solution being represented by the following general formula (1):

$$x(Bi_{1/2}Na_{1/2})TiO_3 - y(Bi_{1/2}Li_{1/2})TiO_3 - z(Bi_{1/2}K_{1/2})TiO_3 \quad (1)$$

wherein x, y and z satisfy the following formulas (2), (3), (4) and (5)

$$0.80 \leq x \leq 0.96 \quad (2)$$

$$0.02 \leq y \leq 0.08 \quad (3)$$

$$0.01 \leq z \leq 0.15 \quad (4)$$

$$x+y+z=1 \quad (5)$$

comprising manganese element dispersed in the major component as an additive, wherein the manganese element content is no greater than 0.93 mass % in terms of MnO with respect to the major component.

2. The piezoelectric ceramic according to claim 1, wherein z in the general formula (1) satisfies formula (6) below $$0.01 \leq z \leq 0.12 \quad (6).$$

3. A piezoelectric ceramic composition comprising a three-component solid solution as a major component, the three-component solid solution being represented by the following general formula (1):

$$x(Bi_{1/2}Na_{1/2})TiO_3 - y(Bi_{1/2}Li_{1/2})TiO_3 - z(Bi_{1/2}K_{1/2})TiO_3 \quad (1)$$

wherein x, y and z satisfy the following formulas (2), (3), (4) and (5)

$$0.80 \leq x \leq 0.96 \quad (2)$$

$$0.02 \leq y \leq 0.08 \quad (3)$$

$$0.01 \leq z \leq 0.15 \quad (4)$$

$$x+y+z=1 \quad (5)$$

comprising manganese element dispersed in the major component as an additive, wherein the manganese element content is no greater than 0.93 mass % in terms of MnO with respect to the major component.

4. The piezoelectric ceramic composition according to claim 3, wherein z in the general formula (1) satisfies the formula (6) below $$0.01 \leq z \leq 0.12 \quad (6).$$

* * * * *